United States Patent
Woo et al.

(10) Patent No.: US 10,711,157 B2
(45) Date of Patent: Jul. 14, 2020

(54) COMPOSITION FOR WINDOW FILM, FLEXIBLE WINDOW FILM FORMED THEREFROM, AND FLEXIBLE DISPLAY DEVICE COMPRISING SAME

(71) Applicants: SAMSUNG SDI CO., LTD., Yongin-si Gyeonggi-do (KR); SAMSUNG ELECTRONICS CO., LTD., Suwon-si Gyeonggi-do (KR)

(72) Inventors: Chang Soo Woo, Suwon-si (KR); Kyoung Ku Kang, Suwon-si (KR); Min Hye Kim, Suwon-si (KR); Ji Hwan Park, Suwon-si (KR); Ji Sun Im, Suwon-si (KR); Seung Woo Jang, Suwon-si (KR); Dong Il Han, Suwon-si (KR)

(73) Assignees: Samsung SDI Co., Ltd., Yongin-si (KR); Samsung Electronics Co., Ltd., Suwon-si (KR)

( * ) Notice: Subject to any disclaimer, the term of this patent is extended or adjusted under 35 U.S.C. 154(b) by 20 days.

(21) Appl. No.: 15/755,486

(22) PCT Filed: Aug. 25, 2016

(86) PCT No.: PCT/KR2016/009433
§ 371 (c)(1),
(2) Date: Feb. 26, 2018

(87) PCT Pub. No.: WO2017/034342
PCT Pub. Date: Mar. 2, 2017

(65) Prior Publication Data
US 2018/0244953 A1 Aug. 30, 2018

(30) Foreign Application Priority Data

Aug. 25, 2015 (KR) .................. 10-2015-0119871
Dec. 22, 2015 (KR) .................. 10-2015-0184267

(51) Int. Cl.
| | | |
|---|---|---|
| *C09D 183/06* | (2006.01) | |
| *H01L 51/52* | (2006.01) | |
| *C09D 183/14* | (2006.01) | |
| *B32B 27/28* | (2006.01) | |
| *C08J 7/04* | (2020.01) | |
| *C08L 83/06* | (2006.01) | |
| *H01L 27/32* | (2006.01) | |
| *H01L 51/00* | (2006.01) | |
| *C08G 77/14* | (2006.01) | |
| *C08G 77/50* | (2006.01) | |

(52) U.S. Cl.
CPC .......... *C09D 183/06* (2013.01); *B32B 27/281* (2013.01); *C08J 7/0427* (2020.01); *C08L 83/06* (2013.01); *C09D 183/14* (2013.01); *H01L 27/323* (2013.01); *H01L 51/0097* (2013.01); *H01L 51/5253* (2013.01); *H01L 51/5281* (2013.01); *C08G 77/14* (2013.01); *C08G 77/50* (2013.01); *C08J 2379/08* (2013.01); *C08J 2483/14* (2013.01); *C08L 2203/206* (2013.01); *C08L 2312/00* (2013.01); *H01L 2251/5338* (2013.01)

(58) Field of Classification Search
CPC ...... C09D 183/06; C09D 183/14; G02B 1/14; C09J 7/29; C09J 2203/318; C09J 2201/162; C09J 2479/086; C09J 2483/006; C08J 7/047; C08J 2379/08; C08J 2483/06; H01L 51/0097; H01L 51/5253; H01L 51/5281; H01L 27/323; H01L 27/3244; H01L 2251/5338; H01L 2251/558; G06F 3/041; G06F 2203/04102; C08G 77/46
See application file for complete search history.

(56) References Cited

U.S. PATENT DOCUMENTS

2002/0156187 A1* 10/2002 Greene .................. C08G 77/14
525/100
2005/0020758 A1 1/2005 Terry

FOREIGN PATENT DOCUMENTS

| JP | 2007-176542 | 7/2007 |
|---|---|---|
| JP | 2009-185213 A | 8/2009 |
| KR | 10-2009-0131274 A | 12/2009 |

(Continued)

OTHER PUBLICATIONS

KR Office Action for corresponding Korean Patent Application No. 10-2015-0184267, dated Jul. 30, 2018, 2 pages.

(Continued)

*Primary Examiner* — Robert S Jones
(74) *Attorney, Agent, or Firm* — Lewis Roca Rothgerber Christie LLP

(57) ABSTRACT

Provided are: a composition for a window film, containing a silicone resin comprising chemical formula 1 below, a cross-linking agent, and an initiator; a window film formed therefrom; and a flexible display device comprising the same. $(R1SiO_{3/2})_x(SiO_{3/2}\text{-}Q\text{-}SiO_{3/2})_y(R_2SiO_{3/2})_z$ (In chemical formula 1, R1 and R2 are each independently a cycloaliphatic epoxy group, a cycloaliphatic epoxy group-containing functional group, a glycidyl group, or a glycidyl group-containing functional group; Q is R3 or -A1-T-A2-; R3 is a substituted or unsubstituted C1 to C10 alkylene group, or a substituted or unsubstituted C6 to C30 arylene group; A1 and A2 are each independently a single bond, or a substituted or unsubstituted C1 to C5 alkylene group; T is a mono- or polyalkylene oxide group, or an imide group-containing functional group; and $0<x<1$, $0<y<1$, $0 \leq z<1$, and $x+y+z=1$.

9 Claims, 2 Drawing Sheets

(56) References Cited

FOREIGN PATENT DOCUMENTS

| KR | 10-2014-0004568 | 1/2014 |
| KR | 10-2014-0104175 | 8/2014 |
| KR | 10-2014-0134147 | 11/2014 |
| KR | 10-2015-0068240 | 6/2015 |

OTHER PUBLICATIONS

Notification of Cancellation dated Oct. 30, 2018 in corresponding Korean Patent Application No. 10-2015-0119871, now issued as KR-1788392 (2 pgs.).

* cited by examiner

【FIG. 1】
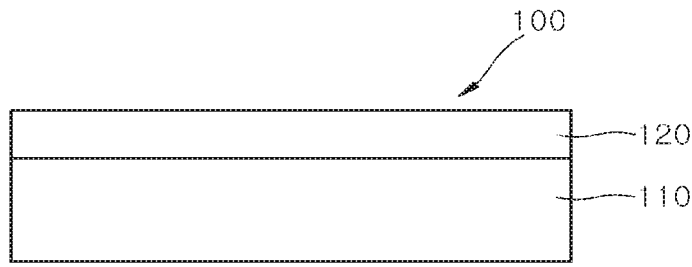
【FIG. 2】
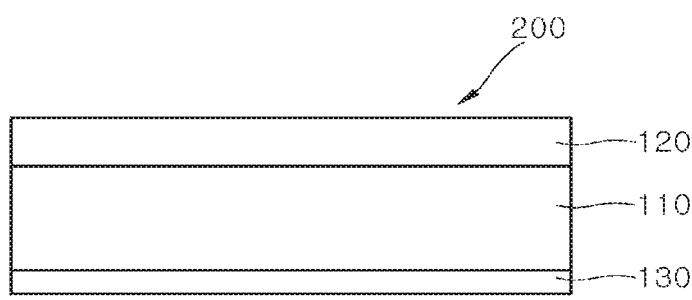
【FIG. 3】
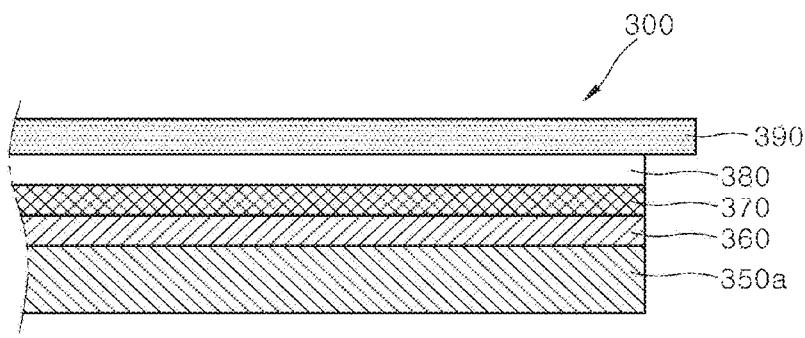
【FIG. 4】
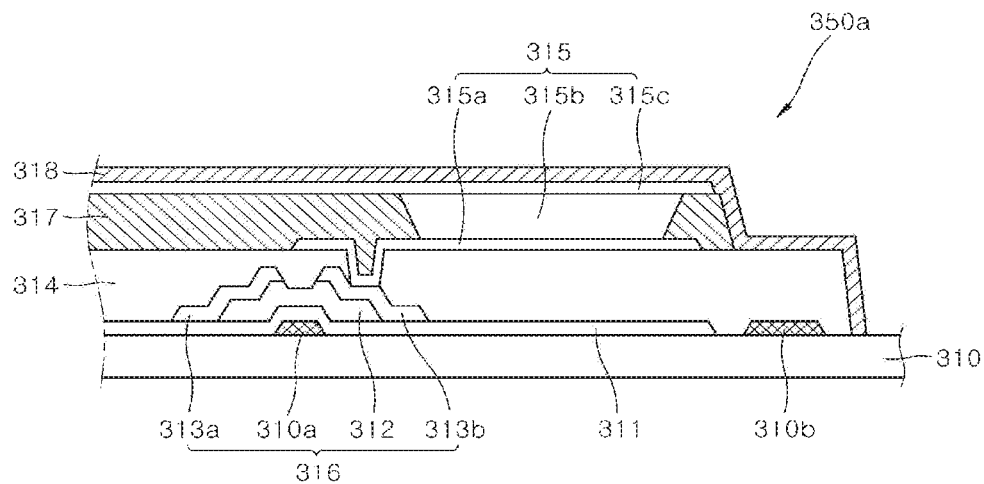

【FIG. 5】
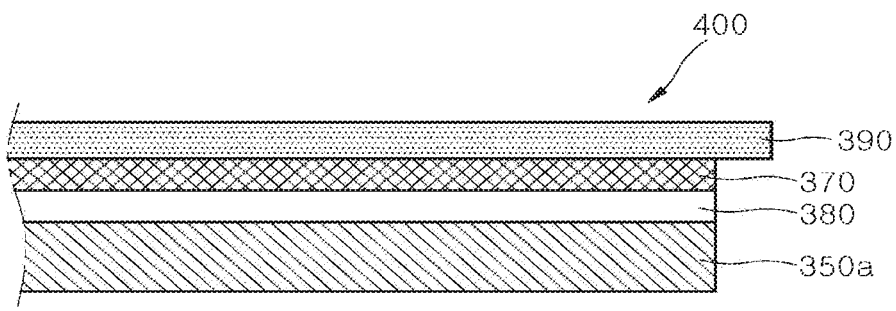
【FIG. 6】
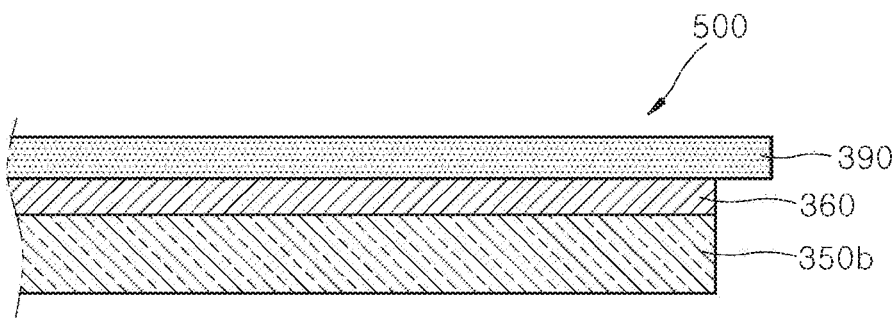

COMPOSITION FOR WINDOW FILM, FLEXIBLE WINDOW FILM FORMED THEREFROM, AND FLEXIBLE DISPLAY DEVICE COMPRISING SAME

CROSS-REFERENCE TO RELATED APPLICATIONS

This application is a National Phase Patent Application and claims priority to and the benefit of International Application Number PCT/KR2016/009433, filed on Aug. 25, 2016, which claims priority to and the benefit of Korean Patent Application No. 10-2015-0119871, filed on Aug. 25, 2015 and claims priority to and the benefit of Korean Patent Application No. 10-2015-0184267, filed on Dec. 22, 2015, the entire contents of all of which are incorporated herein by reference.

BACKGROUND

1. Field

The present invention relates to a composition for window films, a flexible window film formed therefrom, and a flexible display comprising the same.

2. Description of the Related Art

Recently, with the replacement of a glass substrate or a high hardness substrate with a film in a display, a flexible display capable of being folded or unfolded has been developed in the related art. The flexible display is thin and light, has high impact resistance, can be folded and unfolded, and thus can be manufactured in various shapes.

In such a flexible display, not only a substrate but also various elements are required to have flexibility. Particularly, since a window film is disposed at the outermost side of the display, it is necessary for the window film to have flexibility high hardness, and good optical reliability such as light resistance.

The background technique of the present invention is disclosed in Japanese Unexamined Patent Publication No. 2007-176542.

SUMMARY

It is one aspect of the present invention to provide a composition for window films that can realize a flexible window film, which has good properties in terms of hardness, flexibility, optical reliability such as light resistance, and external appearance, can be formed without use of a leveling agent for improving external appearance, and does not suffer from elution of the leveling agent and deterioration in compatibility.

It is another aspect of the present invention to provide a composition for window films that can realize a window film exhibiting good properties in terms of adhesion with respect to a base film, optical transparency, and flexibility.

It is a further aspect of the present invention to provide a flexible window film, which has good properties in terms of hardness, flexibility, optical reliability such as light resistance, and adhesion with respect to a base film.

It is yet another aspect of the present invention to provide a flexible display including the flexible window film as set forth above.

In accordance with one aspect of the present invention, a composition for window films includes: a silicone resin comprising a compound represented by Formula 1; a crosslinking agent; and an initiator.

$$(R^1SiO_{3/2})_x(SiO_{3/2}\text{-}Q\text{-}SiO_{3/2})_y(R^2SiO_{3/2})_z \quad \text{<Formula 1>}$$

(wherein $R^1$ and $R^2$ are each independently an alicyclic epoxy group, an alicyclic epoxy group-containing functional group, a glycidyl group, or a glycidyl group-containing functional group;

Q is $R^3$ or $-A^1\text{-}T\text{-}A^2\text{-}$, $R^3$ being a substituted or unsubstituted $C_1$ to $C_{10}$ alkylene group or a substituted or unsubstituted $C_6$ to $C_{30}$ arylene group, $A^1$ and $A^2$ being each independently a single bond or a substituted or unsubstituted $C_1$ to $C_5$ alkylene group, T being a mono- or polyalkylene oxide group, or an imide group-containing functional group; and $0<x<1$, $0<y<1$, $0 \leq z<1$, and $x+y+z=1$).

In accordance with another aspect of the present invention, a flexible window film includes: a base layer; and a coating layer formed on one surface of the base layer, wherein the coating layer is formed of the composition for window films as set forth above.

In accordance with a further aspect of the present invention, a flexible display includes the flexible window film as set forth above.

The present invention provides a composition for window films that can realize a flexible window film, which has good properties in terms of hardness, flexibility, optical reliability such as light resistance, and external appearance, can be formed without use of a leveling agent for improving external appearance, and does not suffer from elution of the leveling agent and deterioration in compatibility.

The present invention provides a composition for window films that can realize a window film exhibiting good adhesion with respect to a base film.

The present invention provides a flexible window film, which has good properties in terms of hardness, flexibility, optical reliability such as light resistance, adhesion with respect to a base film, and optical transparency.

The present invention provides a flexible display including the flexible window film as set forth above.

BRIEF DESCRIPTION OF DRAWINGS

FIG. 1 is a sectional view of a flexible window film according to one embodiment of the present invention.

FIG. 2 is a sectional view of a flexible window film according to another embodiment of the present invention.

FIG. 3 is a sectional view of a flexible display according to one embodiment of the present invention.

FIG. 4 is a sectional view of one embodiment of a display part shown in FIG. 3.

FIG. 5 is a sectional view of a flexible display according to another embodiment of the present invention.

FIG. 6 is a sectional view of a flexible display according to a further embodiment of the present invention.

DETAILED DESCRIPTION

Embodiments of the present invention will be described in detail with reference to the accompanying drawings. It should be understood that the present invention is not limited to the following embodiments and may be embodied in different ways. In the drawings, portions irrelevant to the description will be omitted for clarity. Like components will be denoted by like reference numerals throughout the specification.

Herein, spatially relative terms such as "upper" and "lower" are defined with reference to the drawings. Thus, it will be understood that the term "upper surface" can be used interchangeably with the term "lower surface". In addition, when an element such as a layer or a film is referred to as being placed "on" another element, it can be directly placed on the other element or intervening element(s) may be present. On the other hand, when an element is referred to as being placed "directly on" another element, there are no intervening element(s) therebetween.

Herein, "pencil hardness" is measured on a coating layer of a window film using a pencil hardness tester (Heidon) in accordance with JIS K5400. In measurement of pencil hardness, pencils of 6B to 9H (Mitsubishi Co., Ltd.) are used. Specifically, pencil hardness is measured under conditions of a pencil load of 1 kg on the coating layer, a scratch angle of 45°, and a scratch speed of 60 mm/min. When the coating layer has one or more scratches after being tested 5 times using a certain pencil, pencil hardness is measured again using another pencil having one-level lower pencil hardness than the previous pencil, and the maximum value of pencil hardness allowing no scratch to be observed all five times on the coating layer is taken as pencil hardness of the coating layer.

Herein, "radius of curvature" means a minimum radius of a jig causing no cracks in a window film specimen when the window film specimen is wound around the jig for measuring radius of curvature (CFT-200R, Covotech Co., Ltd.), kept wound for 5 seconds, unwound, and then observed with the naked eye to determine whether the specimen has cracks. Here, a radius of curvature in a compressive direction is measured when the specimen is wound around the jig such that a window coating layer of the window film contacts a surface of the jig, and a radius of curvature in a tensile direction is measured when the specimen is wound around the jig such that a base layer of the window film contacts the jig. The window film specimen may have a thickness of 50 μm to 300 μm.

Herein, "ΔY.I." refers to a difference (Y2−Y1) between a yellow index (Y1) measured on a window film under a D65 light source at 2° (angle between the window film and the light source) using a colorimeter (CM-3600D, Konica Minolta) and a yellow index (Y2) measured on the window film by the same method after irradiating the window film at a peak wavelength of 306 nm for 72 hours using a light resistance tester (Xe-1, Q-sun).

Herein, the term "(meth)acryl" refers to "acryl" and/or "methacryl".

Herein, "halogen" means fluorine, chlorine, bromine, or iodine.

Herein, unless otherwise stated, "substituted" means that at least one hydrogen atom in a functional group is substituted with a hydroxyl group, an unsubstituted $C_1$ to $C_{10}$ alkyl group, a $C_1$ to $C_{10}$ alkoxy group, a $C_3$ to $C_{10}$ cycloalkyl group, an unsubstituted $C_6$ to $C_{20}$ aryl group, a $C_7$ to $C_{20}$ arylalkyl group, a $C_6$ to $C_{20}$ aryl group substituted with a $C_1$ to $C_{10}$ alkyl group, or a $C_1$ to $C_{10}$ alkyl group substituted with a $C_1$ to $C_{10}$ alkoxy group.

Herein, "alkylene group", "alkyl group", and "alkoxylene group" may be linear or branched types.

Herein, the term "alicyclic epoxy group" means an epoxidized $C_3$ to $C_{20}$ cycloalkyl group.

Herein, the term "alicyclic epoxy group-containing functional group" means an alicyclic epoxy group-containing substituted or unsubstituted $C_1$ to $C_{20}$ alkyl group, substituted or unsubstituted $C_5$ to $C_{20}$ cycloalkyl group, or substituted or unsubstituted $C_6$ to $C_{20}$ aryl group.

Herein, the term "glycidyl group-containing functional group" means a glycidyl group and/or glycidoxy-containing substituted or unsubstituted $C_1$ to $C_{20}$ alkyl group, substituted or unsubstituted $C_5$ to $C_{20}$ cycloalkyl group, or substituted or unsubstituted $C_6$ to $C_{20}$ aryl group.

Herein, "Ec" means an epoxycyclohexylethyl group and "Gp" means a glycidoxypropyl group.

Herein, "glycidoxy" means

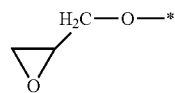

(* is a linking site of an element).

Herein, the term "arylene group" means a bivalent type aryl group. Herein, the term "aryl group" includes a monocyclic, non-fused polycyclic or fused polycyclic functional group. Here, the term "fused" means that a pair of carbon atoms is shared by contiguous rings. The aryl group may refer to a phenyl group, a naphthyl group, an anthracenyl group, a phenanthrenyl group, a pyrenyl group, a chrysenyl group, and the like. The aryl group may also include biphenyl groups, terphenyl groups, or quaterphenyl groups, in which at least two aryl groups are connected to each other through a sigma bond.

Herein, "mono- or polyalkylene oxide group" means *-[—O—$R^a$-]n-[—O—$R^{a'}$-]m-* (* is a linking site of an element; $R^a$ and $R^{a'}$ are each independently a substituted or unsubstituted $C_1$ to $C_5$ alkylene group; n is an integer of 1 to 5; and m is an integer of 0 to 5).

Herein, "imide group-containing functional group" means a compound represented by Formula A or B:

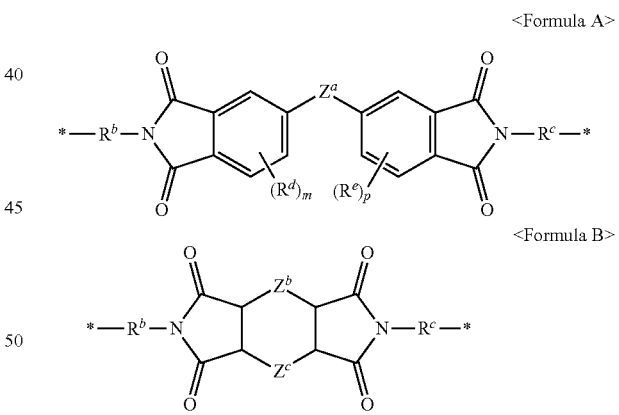

(In Formula A or B, wherein * is a linking site of an element; $R^b$ and $R^c$ are each independently a single bond or a substituted or unsubstituted $C_1$ to $C_5$ alkylene group; $R^d$ and $R^e$ are each independently substituted or unsubstituted $C_1$ to $C_5$ alkyl group; m and p are each independently an integer of 0 to 3; and $Z^a$, $Z^b$ and $Z^c$ are each independently a single bond, —(C=O)—, —O—, —S—, —$SO_2$—, an unsubstituted $C_1$ to $C_5$ alkylene group or a fluorine-substituted $C_1$ to $C_5$ alkylene group (for example: a fluorine-substituted $C_1$ to $C_5$ alkyl group-containing alkylene group)).

Hereinafter, a composition for window films according to one embodiment of the present invention will be described.

The composition for window films according to the present invention may include a silicone resin comprising a compound represented by Formula 1, a crosslinking agent, and an initiator. With the silicone resin comprising a compound represented by Formula 1, the composition for window films can realize a flexible window film, which has good properties in terms of hardness, flexibility, optical reliability such as light resistance, and external appearance, can be formed without use of a leveling agent for improving external appearance, and does not suffer from elution of the leveling agent and deterioration in compatibility.

Particularly, the composition for window films according to this embodiment can realize a window film having sufficiently high hardness even without nanoparticles. In addition, when the composition for window films includes the nanoparticles, the composition can achieve additional increase in hardness, thereby providing a window film having further improved hardness.

In addition, since the silicone resin comprising a compound represented by Formula 1 can be prepared by adjusting the ratio of silicone monomers described below depending upon properties of the composition for window films, it is possible to achieve easy control of desired properties of a window film in terms of hardness, flexibility, and optical reliability such as transparency and light resistance. The composition for window films according to this embodiment can exhibit adhesion to a base layer described below, particularly a film formed of a polyimide resin, a polyester resin, and the like.

The composition for window films according to the embodiment may include the silicone resin comprising a compound represented by Formula 1; the crosslinking agent; and the initiator.

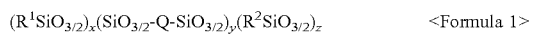

$(R^1SiO_{3/2})_x(SiO_{3/2}\text{-}Q\text{-}SiO_{3/2})_y(R^2SiO_{3/2})_z$  <Formula 1>

(In Formula 1, wherein $R^1$ and $R^2$ are each independently an alicyclic epoxy group, an alicyclic epoxy group-containing functional group, a glycidyl group, or a glycidyl group-containing functional group;

Q is $R^3$ or $-A^1\text{-}T\text{-}A^2\text{-}$, $R^3$ being a substituted or unsubstituted $C_1$ to $C_{10}$ alkylene group or a substituted or unsubstituted $C_6$ to $C_{30}$ arylene group, $A^1$ and $A^2$ being each independently a single bond or a substituted or unsubstituted $C_1$ to $C_5$ alkylene group, T being a mono- or polyalkylene oxide group, or an imide group-containing functional group; and $0<x<1$, $0<y<1$, $0\leq z<1$, and $x+y+z=1$).

Hereinafter, the silicone resin comprising a compound represented by Formula 1 (which can also be simply referred to as the 'silicone resin' in the following description) will be described.

In Formula 1, $R^1$ provides crosslinkability to the silicone resin. Specifically, $R^1$ may be an alicyclic epoxy group-containing substituted or unsubstituted $C_1$ to $C_5$ alkyl group, more specifically an (epoxycyclohexyl)methyl group, an (epoxycyclohexyl)ethyl group, an (epoxycyclohexyl)propyl group, a glycidoxy group, or a glycidoxypropyl group.

In Formula 1, $SiO_{3/2}$-Q-$SiO_{3/2}$ increases hardness of a window film through increase in crosslinking degree of the window film while improving flexibility of the window film. In addition, $SiO_{3/2}$-Q-$SiO_{3/2}$ can improve optical reliability of the window film.

Furthermore, in Formula 1, $SiO_{3/2}$-Q-$SiO_{3/2}$ can improve pencil hardness and optical transparency of the window film, and can ensure that the window film has good external appearance even without a leveling agent, does not suffer from problems due to use of the leveling agent, such as decrease in hardness, elution of the leveling agent, deterioration in compatibility, and low compatibility between the leveling agent and the silicone resin, and can secure good effects of the leveling agent.

A window film formed of a composition for window films including a silicone resin comprising $R^1SiO_{3/2}$ and a second silicone monomer providing $SiO_{3/2}$—$R^2$—$SiO_{3/2}$ in a non-polymerized state instead of the silicone resin of Formula 1 can exhibit poor properties in terms of hardness, flexibility and optical reliability.

In Formula 1, Q may be $R^3$ or $-A^1\text{-}T\text{-}A^2\text{-}$.

In one embodiment in which Q is $R^3$, the composition for window films can further improve properties of the window film in terms of hardness, flexibility and optical reliability such as light resistance, and can realize a window film having sufficiently high hardness even without using nanoparticles.

Specifically, $R^3$ may be a $C_1$ to $C_8$ alkylene group or a $C_6$ to $C_{20}$ arylene group. Here, the "alkylene group" may be a linear or branched alkylene group. More specifically, $R^2$ may be a methylene group, an ethylene group, a propylene group, a butylene group, a pentylene group, a hexylene group, a heptylene group, an octylene group, or a phenylene group.

In another embodiment in which Q is $-A^1\text{-}T\text{-}A^2\text{-}$, the composition for window films can ensure that the window film has good pencil hardness, good optical transparency, and good external appearance even without using a leveling agent, does not suffer from problems due to use of the leveling agent, such as decrease in hardness, elution of the leveling agent, deterioration in compatibility, and low compatibility between the leveling agent and a siloxane resin, and can secure good effects of the leveling agent.

Specifically, $A^1$ and $A^2$ are each independently a single bond, an ethylene group, an n-propylene group, an iso-propylene group, a 1,2-butylene group, a 1,3-butylene group, a 1,4-butylene group, or a 2,3-butylene group.

Specifically, T may be $*\text{-}[\text{---}O\text{---}C_2H_4\text{-}]_n\text{-}*$, $*\text{-}[\text{---}O\text{---}CHCH_3CH_2\text{-}]_n\text{-}[\text{---}OC_2H_4\text{---}]\text{-}*$, or the composition represented by Formula A, in which Za is a fluorine-substituted $C_1$ to $C_5$ alkylene group. Here, * means a linking site of an element.

In one embodiment in which Q is $R^3$ in Formula 1, x, y and z may be set to satisfy $0.85\leq x<1$, $0<y\leq 0.2$, and $z=0$, specifically, $0.85\leq x\leq 0.999$ and $0.001\leq y\leq 0.2$, more specifically $0.95\leq x\leq 0.99$ and $0.01\leq y\leq 0.1$. Within these ranges, the composition for window films can exhibit good coatability and can secure good window film properties in terms of flexibility and optical reliability. Particularly, when x and y are set to satisfy $0.95\leq x\leq 0.99$ and $0.01\leq y\leq 0.1$, the window film exhibits good properties in terms of hardness, flexibility, optical reliability, and adhesion to a base layer.

In another embodiment in which Q is $-A^1\text{-}T\text{-}A^2\text{-}$ in Formula 1, x, y and z may be set to satisfy $0.90\leq x\leq 0.99$, $0.01\leq y\leq 0.10$, and $z=0$, specifically $0.955\leq x\leq 0.99$, $0.01\leq y\leq 0.05$, $z=0$, and $x+y=1$. Within these ranges, the composition can realize a window film having good properties in terms of hardness, external appearance and flexibility, and can ensure that the window film has good external appearance even without using a leveling agent, does not suffer from problems due to use of the leveling agent, such as decrease in hardness, elution of the leveling agent, and low compatibility between the leveling agent and the silicone resin, and can secure good effects of the leveling agent.

In another embodiment in which Q is $-A^1\text{-}T\text{-}A^2\text{-}$ in Formula 1, x, y and z may be set to satisfy $0.70\leq x\leq 0.98$, $0.01 \leq y \leq 0.10$, and $0.01 \leq z \leq 0.20$, specifically $0.855 \leq x \leq 0.98$, $0.01 \leq y \leq 0.05$, and $0.01 \leq z \leq 0.10$, more specifically $0.90 \leq x \leq 0.96$, $0.01 \leq y \leq 0.03$, $0.035 \leq z \leq 0.07$, and $x+y+z=1$. Within these ranges, the composition can realize a window film having good properties in terms of hardness, external appearance and flexibility, and can ensure that the window film has good external appearance even without using a leveling agent, does not suffer from problems due to use of the leveling agent, such as decrease in hardness, elution of the leveling agent, and low compatibility between the leveling agent and the silicone resin, and can secure good effects of the leveling agent.

The silicone resin may have a weight average molecular weight of about 1,000 to about 30,000, specifically about 1,000 to about 250,000, more specifically about 4,000 to about 20,000, still more specifically about 4,000 to about 10,000, for example, 4,000, 4,500, 5,000, 5,500, 6,000, 6,500, 7,000, 7,500, 8,000, 8,500, 9,000, 9,500, or 10,000. Within this range, the silicone resin can support a coating layer of the window film while improving flexibility and optical reliability of the window film. The silicone resin may have a polydispersity index (PDI) of about 1.0 to about 10.0, specifically about 1.0 to about 4.0, more specifically about 1.0 to about 3.0, still more specifically about 1.5 to about 3.0, still more specifically about 1.5 to about 2.5. Within this range, the composition can exhibit good coatability while securing stable coating properties. The silicone resin may have an epoxy equivalent weight of about 0.1 mol/100 g to about 1.0 mol/100 g, specifically about 0.3 mol/100 g to about 0.8 mol/100 g, for example, 0.3 mol/100 g, 0.4 mol/100 g, 0.5 mol/100 g, 0.6 mol/100 g, 0.7 mol/100 g, or 0.8 mol/100 g. Within this range, the composition can exhibit good coatability while securing stable coating properties.

The silicone resin may be used alone or as a mixture thereof in the composition for window films. In the silicone resin, each of $(R^1SiO_{3/2})$ and $(SiO_{3/2}\text{-Q-}SiO_{3/2})$ may be included alone or as a mixture thereof.

Specifically, when Q is $R^3$, the silicone resin represented by Formula 1 may include at least one of compounds represented by Formula 1-1 to Formula 1-8:

$(EcSiO_{3/2})_x(SiO_{3/2}\text{—}C_2H_4\text{—}SiO_{3/2})_y$ <Formula 1-1>

$(EcSiO_{3/2})_x(SiO_{3/2}\text{—}C_6H_4\text{—}SiO_{3/2})_y$ <Formula 1-2>

$(GpSiO_{3/2})_x(SiO_{3/2}\text{—}C_2H_4\text{—}SiO_{3/2})_y$ <Formula 1-3>

$(GpSiO_{3/2})_x(SiO_{3/2}\text{—}C_6H_4\text{—}SiO_{3/2})_y$ <Formula 1-4>

$(EcSiO_{3/2})_x(SiO_{3/2}\text{—}C_6H_{12}\text{—}SiO_{3/2})_y$ <Formula 1-5>

$(GpSiO_{3/2})_x(SiO_{3/2}\text{—}C_6H_{12}\text{—}SiO_{3/2})_y$ <Formula 1-6>

$(EcSiO_{3/2})_x(SiO_{3/2}\text{—}C_8H_{16}\text{—}SiO_{3/2})_y$ <Formula 1-7>

$(GpSiO_{3/2})_x(SiO_{3/2}\text{—}C_8H_{16}\text{—}SiO_{3/2})_y$ <Formula 1-8>

(in Formulae 1-1 to 1-8, Ec is an epoxycyclohexylethyl group, Gp is a glycidoxypropyl group, $0<x<1$, $0<y<1$, and $x+y=1$).

Specifically, when Q is $-A^1\text{-T-}A^2\text{-}$, the silicone resin represented by Formula 1 may include at least one of compounds represented by Formulae 1-9 to 1-26.

$(EcSiO_{3/2})_x(SiO_{3/2}\text{—}C_2H_4\text{—}[\text{—}O\text{—}C_2H_4\text{-}]_2\text{-}SiO_{3/2})_y$ <Formula 1-9>

$(EcSiO_{3/2})_x(SiO_{3/2}\text{—}C_2H_4\text{—}[\text{—}O\text{—}C_2H_4\text{-}]_3\text{-}SiO_{3/2})_y$ <Formula 1-10>

$(EcSiO_{3/2})_x(SiO_{3/2}\text{—}C_2H_4\text{—}[\text{—}O\text{—}C_2H_4\text{-}]_4\text{-}SiO_{3/2})_y$ <Formula 1-11>

$(EcSiO_{3/2})_x(SiO_{3/2}\text{—}C_2H_4\text{—}[\text{—}O\text{—}C_2H_4\text{-}]_5\text{-}SiO_{3/2})_y$ <Formula 1-12>

$(GpSiO_{3/2})_x(SiO_{3/2}\text{—}C_2H_4\text{—}[\text{—}O\text{—}C_2H_4\text{-}]_2\text{-}SiO_{3/2})_y$ <Formula 1-13>

$(GpSiO_{3/2})_x(SiO_{3/2}\text{—}C_2H_4\text{—}[\text{—}O\text{—}C_2H_4\text{-}]_3\text{-}SiO_{3/2})_y$ <Formula 1-14>

$(GpSiO_{3/2})_x(SiO_{3/2}\text{—}C_2H_4\text{—}[\text{—}O\text{—}C_2H_4\text{-}]_4\text{-}SiO_{3/2})_y$ <Formula 1-15>

$(GpSiO_{3/2})_x(SiO_{3/2}\text{—}C_2H_4\text{—}[\text{—}O\text{—}C_2H_4\text{-}]_5\text{-}SiO_{3/2})_y$ <Formula 1-16>

$(EcSiO_{3/2})_x(SiO_{3/2}\text{—}C_2H_4\text{—}[\text{—}O\text{—}CHCH_3CH_2\text{-}]_2\text{-}[\text{—}OC_2H_4\text{—}]\text{-}SiO_{3/2})_y$ <Formula 1-17>

$(GpSiO_{3/2})_x(SiO_{3/2}\text{—}C_2H_4\text{—}[\text{—}O\text{—}CHCH_3CH_2\text{-}]_2\text{-}[\text{—}OC_2H_4\text{—}]\text{-}SiO_{3/2})_y$ <Formula 1-18>

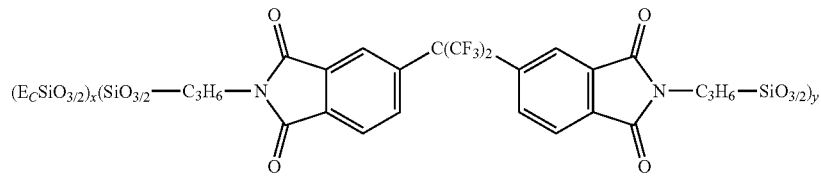

<Formula 1-19>

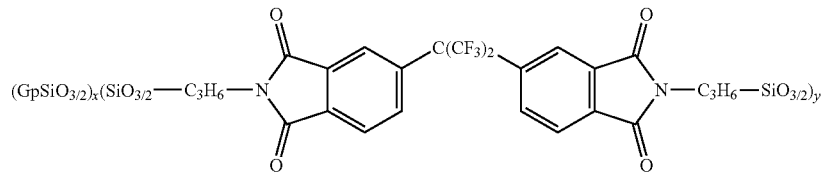

<Formula 1-20>

(in Formulae 1-9 to 1-20, $0<x<1$, $0<y<1$, and $x+y=1$)

$(EcSiO_{3/2})_x(SiO_{3/2}\text{—}C_2H_4\text{—}[\text{—}O\text{—}C_2H_4\text{-}]_2\text{-}SiO_{3/2})_y(GpSiO_{3/2})_z$ <Formula 1-21>

$(EcSiO_{3/2})_x(SiO_{3/2}\text{—}C_2H_4\text{—}[\text{—}O\text{—}C_2H_4\text{-}]_3\text{-}SiO_{3/2})_y(GpSiO_{3/2})_z$ <Formula 1-22>

$(EcSiO_{3/2})_x(SiO_{3/2}\text{—}C_2H_4\text{—}[\text{—}O\text{—}C_2H_4\text{-}]_4\text{-}SiO_{3/2})_y(GpSiO_{3/2})$ <Formula 1-23>

$(EcSiO_{3/2})_x(SiO_{3/2}\text{—}C_2H_4\text{—}[\text{—}O\text{—}C_2H_4\text{-}]_5\text{-}SiO_{3/2})_y(GpSiO_{3/2})_z$ <Formula 1-24>

$(EcSiO_{3/2})_x(SiO_{3/2}\text{—}C_2H_4\text{—}[\text{—}O\text{—}CHCH_3CH_2\text{-}]_2\text{-}[\text{—}OC_2H_4\text{—}]\text{-}SiO_{3/2})_y(GpSiO_{3/2})_z$ <Formula 1-25>

<Formula 1-26>

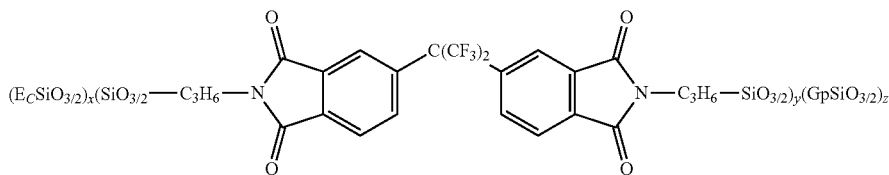

(in Formulae 1-21 to 1-26, 0<x<1, 0<y<1, 0<z≤1, and x+y+z=1).

Next, a method of preparing the silicone resin will be described.

The silicone resin may be prepared through hydrolysis and condensation of a monomer mixture of a first silicone monomer and a second silicone monomer or a monomer mixture of the first silicone monomer and a third silicone monomer.

In the silicone monomer mixture, the first silicone monomer may be present in an amount of about 80 mol % to less than about 100 mol %, specifically about 80 mol % to about 99.9 mol %, specifically about 90 mol % to about 99 mol %, for example, 90 mol %, 91 mol %, 92 mol %, 93 mol %, 94 mol %, 95 mol %, 96 mol %, 97 mol %, 98 mol %, or 99 mol %. In the silicone monomer mixture, the second silicone monomer may be present in an amount of grater than about 0 mol % and about 20 mol % or less, specifically about 0.1 mol % to about 20 mol %, more specifically about 1 mol % to about 10 mol %, for example, 1 mol %, 2 mol %, 3 mol %, 4 mol %, 5 mol %, 6 mol %, 7 mol %, 8 mol %, 9 mol %, or 10 mol % In the silicone monomer mixture, the third silicone monomer may be present in an amount of about 0.1 mol % to about 10 mol %, about 1 mol % to about 10 mol %, for example, 1 mol %, 2 mol %, 3 mol %, 4 mol %, 5 mol %, 6 mol %, 7 mol %, 8 mol %, 9 mol %, or 10 mol %. Within these ranges, the composition for window films can secure good properties of the window film in terms of optical reliability, pencil hardness and external appearance while providing a low radius of curvature to secure good flexibility.

The first silicone monomer may include a silane compound represented by $R^1$ of Formula 1. Specifically, the first silicone monomer may include compounds represented by Formula 2. These may be used alone or as a mixture thereof:

<Formula 2>

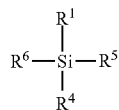

(In Formula 2, wherein $R^1$ is the same as defined in Formula 1; and $R^4$, $R^5$ and $R^6$ are each independently a hydroxyl group or a $C_1$ to $C_{10}$ alkoxy group). More specifically, the first silicone monomer is a trialkoxysilane compound and may include, for example, 2-(3,4-epoxycyclohexyl)ethyltrimethoxysilane(2-(3,4-epoxycyclohexyl) ethyltrimethoxysilane), 2-(3,4-epoxycyclohexyl) ethyltriethoxysilane(2-(3,4-epoxycyclohexyl) ethyltriethoxysilane), (3-glycidoxypropyl)trimethoxysilane ((3-glycidoxypropyl)trimethoxysilane), and (3-glycidoxypropyl)triethoxysilane((3-glycidoxypropyl)triethoxysilane), without being limited thereto.

The second silicone monomer may include a silane compound having the compounds represented by ($SiO_{3/2}$-Q-$SiO_{3/2}$) of Formula 1. Specifically, the second silicone monomer may include compounds represented by Formula 3. These may be used alone or as a mixture thereof:

<Formula 3>

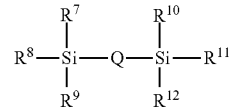

(in Formula 3, wherein Q is the same as defined in Formula 1, and $R^7$, $R^8$, $R^9$, $R^{10}$, $R^{11}$ and $R^{12}$ are each independently a hydroxyl group or a $C_1$ to $C_{10}$ alkoxy group).

More specifically, the second silicone monomer may be prepared through hydrosilylation between a divinyl ether monomer and trialkoxysilane. Here, the divinyl ether monomer may include at least one of ethylene glycol divinyl ether, di(ethylene glycol)divinyl ether, tri(ethylene glycol)divinyl ether, tetra(ethylene glycol)divinyl ether, and 2-(ethenyloxy) 1-[2-(ethenyloxy)-1-methylethoxy]propane, and the trialkoxysilane may include at least one of triethoxysilane, trimethoxysilane, and tripropoxysilane. For hydrosilylation reaction, a platinum catalyst may be added in order to increase the reaction rate.

For example, the second silicone monomer may include at least one of 1,2-bis(triethoxysilyl)ethane(1,2-bis(triethoxysilyl)ethane), 1,2-bis(trimethoxysilyl)ethane(1,2-bis (trimethoxysilyl)ethane), 1,6-bis(triethoxysilyl)hexane(1,6-bis(triethoxysilyl)hexane), 1,6-bis(trimethoxysilyl)hexane (1,6-bis(trimethoxysilyl)hexane), 1,8-bis(triethoxysilyl) octane(1,8-bis(triethoxysilyl)octane), 1,8-bis (trimethoxysilyl)octane(1,8-bis(trimethoxysilyl)octane), and 1,4-bis(triethoxysilyl)benzene(1,4-bis(triethoxysilyl) benzene).

The third silicone monomer may include compounds represented by Formula 4. These may be used alone or as a mixture thereof:

<Formula 4>

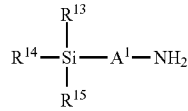

(In Formula 4, wherein $R^{13}$, $R^{14}$ and $R^{15}$ are each independently a halogen, a hydroxyl group, or a $C_1$ to $C_{10}$ alkoxy group).

Specifically, the third silicone monomer may include 3-aminopropyltrimethoxysilane, 3-aminopropyltriethoxysilane, and the like.

In one embodiment in which Q is $R^3$, the silicone resin represented by Formula 1 may be prepared through hydrolysis and condensation of a monomer mixture of the first silicone monomer and a second silicone monomer represented by Formula 3-1.

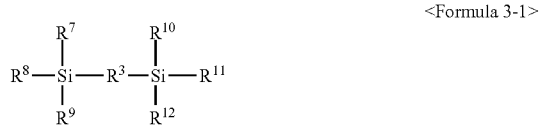
<Formula 3-1>

(In Formula 3-1, wherein $R^3$ is the same as defined in Formula 1, and $R^7$, $R^8$, $R^9$, $R^{10}$, $R^{11}$ and $R^{12}$ are each independently a hydroxyl group or a $C_1$ to $C_{10}$ alkoxy group).

In another embodiment the silicone resin represented by Formula 1 may be prepared through hydrolysis and condensation of a monomer mixture of the first silicone monomer and a second silicone monomer represented by Formula 3-2.

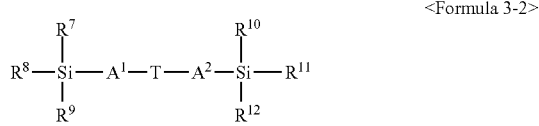
<Formula 3-2>

(In Formula 3-2, wherein $-A^1-T-A^2-$ is the same as defined in Formula 1, and $R^7$, $R^8$, $R^9$, $R^{10}$, $R^{11}$ and $R^{12}$ are each independently a hydroxyl group or a $C_1$ to $C_{10}$ alkoxy group).

In a further embodiment, the silicone resin represented by Formula 1 may be prepared through hydrolysis and condensation of the monomer mixture of the first silicone monomer and the third silicone monomer. In this case, the method of preparing the silicone resin may further include adding a bifunctional anhydride to the monomer mixture.

Specifically, the monomer mixture may include 80 mol % to 99 mol % of the first silicone monomer, 0.1 mol % to 10 mol % of the third silicone monomer, and 0.1 mol % to 10 mol % of the bifunctional anhydride.

Specifically, the bifunctional anhydride may be represented by Formula 5 or Formula 6, and may be used alone or as a mixture thereof.

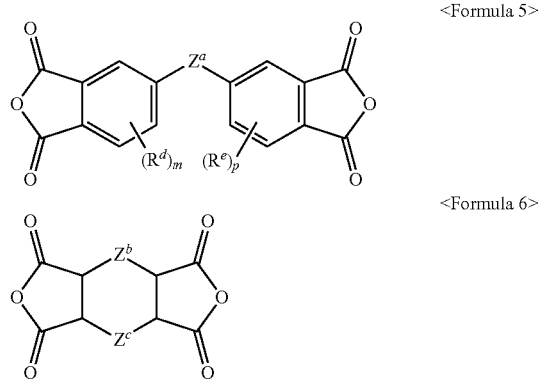
<Formula 5>

<Formula 6>

(In Formula 5 and Formula 6, wherein $R^d$, $R^e$, $Z^a$, $Z^b$, $Z^c$, m and p are the same as defined in Formulae A and B, and $A^1$ is the same as defined in Formula 1).

For example, the bifunctional anhydride may include 4,4'-(hexafluoroisopropylidene)diphthalic dianhydride, 3,3',4,4'-biphenyl tetracarboxylic dianhydride, and the like.

Hydrolysis and condensation of the silicone monomer mixture may be performed by a method for preparation of a typical silicone resin. Hydrolysis may include reacting the monomer mixture in a mixture of water and at least one of an acid and a base. Specifically, the acid may include a strong acid such as HCl, $HNO_3$, and the like, and the base may include a strong base such as NaOH, KOH, and the like. Hydrolysis may be performed at about 20° C. to 100° C. for about 10 minutes to about 7 hours. Under these conditions, hydrolysis efficiency of the first and second silicone monomers can be improved. Condensation may be performed at about 50° C. to 100° C. for about 10 minutes to about 12 hours under the same conditions as hydrolysis. Under these conditions, hydrolysis efficiency of the first and second silicone monomers can be improved.

Next, the crosslinking agent will be described.

The crosslinking agent may contain a crosslinkable functional group to improve hardness of the window film. In addition, the crosslinking agent can improve flexibility and optical reliability of the window film together with the silicone resin comprising a compound represented by Formula 1. Herein, the term "crosslinkable functional group" may mean an epoxy group or an oxetane group.

The crosslinking agent may further include at least one of a non-cyclic aliphatic hydrocarbon group, a cyclic aliphatic hydrocarbon group, and a hydrogenated aromatic hydrocarbon group in order to further improve flexibility of a coating layer.

Specifically, the crosslinking agent may include at least one of a non-cyclic aliphatic epoxy monomer, a cyclic aliphatic epoxy monomer, a hydrogenated aromatic hydrocarbon epoxy monomer, and an oxetane monomer. These crosslinking agents may be used alone or as a mixture thereof. Particularly, the cyclic aliphatic epoxy monomer can realize a window film having high hardness and good flexibility together with the silicone resin of Formula 1 when applied to a base layer of a polyimide film.

The non-cyclic aliphatic epoxy monomer may include 1,4-butanediol diglycidyl ether, 1,6-hexanediol diglycidyl ether, neopentylglycol diglycidyl ether, 1,7-octadiene diepoxide, trimethylolpropane triglycidyl ether, polyethyleneglycol diglycidyl ether, glycerin triglycidyl ether, polypropyleneglycol diglycidyl ether; polyglycidyl ethers of polyetherpolyol obtained by adding one or more types of alkylene oxide to aliphatic polyhydric alcohols, such as ethylene glycol, propylene glycol, glycerin, and the like; diglycidyl esters of aliphatic long-chain dibasic acids; monoglycidyl ethers of higher aliphatic alcohols; glycidyl ethers of higher fatty acids; epoxylated soybean oil; epoxy stearic acid butyl; epoxy stearic acid octyl; epoxylated linseed oil; epoxylated polybutadiene, and the like.

The cyclic aliphatic epoxy monomer is a compound having at least one epoxy group in an alicyclic group. Specifically, the cyclic aliphatic epoxy monomer may include alicyclic epoxy carboxylate and alicyclic epoxy (meth)acrylate. More specifically, the cyclic aliphatic epoxy monomer may include 3,4-epoxycyclohexyl)methyl-3',4'-epoxycyclohexanecarboxylate, diglycidyl 1,2-cyclohexanedicarboxylate, 2-(3,4-epoxycyclohexyl-5,5-spiro-3,4-epoxy)cyclohexane-meta-dioxane, bis(3,4-epoxycyclohexylmethyl)adipate, bis(3,4-epoxy-6-methylcyclohexylmethyl)adipate, 3,4-epoxy-6-methylcyclohexylmethyl-3',4'-epoxy-6'-methylcyclohexanecarboxylate, ε-caprolactone modified 3,4-epoxycyclohexylmethyl-3',4'-epoxy-cyclohexanecarboxylate, trimethylcaprolactone modified 3,4-epoxycyclohexylmethyl-3',4'-epoxy-cyclohexanecarboxylate, β-methyl-δ-valerolactone modified 3,4-epoxycyclohexylmethyl-3',4'-epoxycyclohexanecarboxylate, 1,4-cyclohexanedimethanol bis(3,4-epoxycyclohexanecarboxylate), ethyleneglycol di(3,4-epoxycyclohexylmethyl)ether, ethylenebis(3,4-epoxycyclohexanecarboxylate), 3,4-epoxycyclohexylmethyl(meth)acrylate, 4-vinylcyclohexen dioxide, vinylcyclohexene monoxide, 1,4-cyclohexanedimethanol diglycidyl ether, 2,2'-((1-methylethylidene)bis(cyclohexane-4,1-diyloxymethylene))bisoxirane, and the like.

The hydrogenated aromatic hydrocarbon epoxy monomer means a compound obtained by selective hydrogenation of an aromatic epoxy monomer in the presence of a catalyst under pressure. The aromatic epoxy monomer may include, for example, bisphenol type epoxy resins such as diglycidyl ether of bisphenol A, diglycidyl ether of bisphenol F, and diglycidyl ether of bisphenol S; novolac type epoxy resins such as a phenol novolac epoxy resin, a cresol novolac epoxy resin, and a hydroxybenzaldehyde phenol novolac epoxy resin; and polyfunctional epoxy resins such as glycidyl ether of tetra-hydroxyphenyl methane, glycidyl ether of tetrahydroxybenzophenone, and epoxylated polyvinyl phenol.

The oxetane monomer may include at least one of 3-methyloxetane, 2-methyloxetane, 2-ethylhexyloxetane, 3-oxetanol, 2-methyleneoxetane, 3,3-oxetanedimethanethiol, 4-(3-methyloxetan-3-yl)benzonitrile, N-(2,2-dimethylpropyl)-3-methyl-3-oxetanmethaneamine, N-(1,2-dimethylbutyl)-3-methyl-3-oxetanmethaneamine, (3-ethyloxetan-3-yl)methyl (meth)acrylate, 4-[(3-ethyloxetan-3-yl)methoxy]butan-1-ol, 3-ethyl-3-hydroxymethyloxetane, xylene bisoxetane, and 3-[ethyl-3[[(3-ethyloxetan-3-yl]methoxy]oxetane, without being limited thereto.

Relative to 100 parts by weight of the silicone resin, the crosslinking agent may be present in an amount of about 0.1 parts by weight to about 50 parts by weight, specifically about 1 part by weight to about 30 parts by weight, about 3 parts by weight to about 30 parts by weight, about 5 parts by weight to about 30 parts by weight, more specifically about 5 parts by weight to about 25 parts by weight, still more specifically about 5 parts by weight to about 20 parts by weight, for example, 5 parts by weight, 6 parts by weight, 7 parts by weight, 8 parts by weight, 9 parts by weight, 10 parts by weight, 11 parts by weight, 12 parts by weight, 13 parts by weight, 14 parts by weight, 15 parts by weight, 16 parts by weight, 17 parts by weight, 18 parts by weight, 19 parts by weight, or 20 parts by weight. Within this range, the composition can secure improvement in hardness, flexibility and optical reliability of the window film.

Next, the initiator will be described.

The initiator can cure the silicone resin comprising a compound represented by Formula 1 and the crosslinking agent, and may include at least one of a photocationic initiator and a photo-radical initiator. These initiators may be used alone or as a mixture thereof.

As the photocationic initiator, any typical photocationic initiator known to those skilled in the art may be used. Specifically, the photocationic initiator may include at least one onium salt containing a cation and an anion. Examples of the cation may include diaryliodonium such as diphenyliodonium, 4-methoxydiphenyliodonium, bis(4-methylphenyl)iodonium, bis(4-tert-butylphenyl)iodonium, bis(dodecylphenyl)iodonium; triarylsulfonium such as triphenylsulfonium, diphenyl-4-thiophenylphenylsulfonium, and diphenyl-4-thiophenoxyphenylsulfonium; bis[4-(diphenylsulfonio)phenyl]sulfide, and the like. Examples of the anion may include hexafluorophosphate ($PF_6^-$), tetrafluoroborate ($BF_4^-$), hexafluoroantimonate ($SbF_6^-$), hexafluoroarsenate ($AsF_6^-$), hexachloroantimonate ($SbCl_6^-$), and the like.

Relative to 100 parts by weight of the silicone resin, the initiator may be present in an amount of about 0.01 parts by weight to about 20 parts by weight, specifically about 0.1 parts by weight to about 20 parts by weight, about 0.1 parts by weight to about 10 parts by weight, about 0.5 parts by weight to about 10 parts by weight, more specifically about 1 part by weight to about 5 parts by weight, for example, 1 part by weight, 2 parts by weight, 3 parts by weight, 4 parts by weight, or 5 parts by weight. Within this range, the silicone resin can be sufficiently cured without deterioration in transparency of the window film due to remaining initiator.

The composition for window films according to this embodiment may further include nanoparticles.

The nanoparticles can further improve hardness of the window film. The nanoparticles may include at least one of silica, aluminum oxide, zirconium oxide, and titanium oxide, without being limited thereto. The nanoparticles may also be subjected to surface treatment with a silicone compound for mixing with the silicone resin. The nanoparticles may include spherical, flake, or amorphous particles, and may have an average particle size of 1 nm to 200 nm, specifically 10 nm to 50 nm, without being limited thereto. The nanoparticles may be present in an amount of about 0.1 parts by weight to about 60 parts by weight, specifically about 10 parts by weight to about 50 parts by weight, relative to 100 parts by weight of the silicone resin. Within these ranges of particle size and content, the nanoparticles can further increase hardness of the window film without affecting surface roughness and transparency of the window film.

The composition for window films according to this embodiment may further include additives. The additives can provide additional functions to the window film. The additives may be any additives commonly used for window films in the related art. Specifically, the additives may include at least one of a UV absorbent, a reaction inhibitor, an adhesion promoter, a thixotropic agent, a conductivity imparting agent, a color adjusting agent, a stabilizer, an antistatic agent, an antioxidant, and a leveling agent, without being limited thereto. The reaction inhibitor may include ethynylcyclohexane. The adhesion promoter may include an epoxy or alkoxysilane group-containing silane compound. The thixotropic agent may be fumed silica. The conductivity imparting agent may include metal powder such as silver powder, copper powder, aluminum powder, and the like. The color adjusting agent may include pigments, dyes, and the like. The UV absorbent can improve light resistance of the window film. The UV absorbent may be any typical absorbent known to those skilled in the art. Specifically, the UV absorbent may include at least one of triazine, benzimidazole, benzophenone, and benzotriazole UV absorbents, without being limited thereto. The additives may be present in an amount of about 0.01 parts by weight to about 5 parts by weight, specifically about 0.1 parts by weight to about 2.5 parts by weight, for example, 0.1 parts by weight, 0.5 parts by weight, 2.0 parts by weight, or 2.5 parts by weight, relative to 100 parts by weight of the silicone resin. Within this range, the additives can improve hardness and flexibility of the window film while realizing effects thereof.

The composition for window films according to this embodiment may further include a solvent to improve coatability, wettability or processability. The solvent may include methylethylketone, methylisobutylketone, propylene glycol monomethyl ether, and propylene glycol monomethyl ether acetate, without being limited thereto.

Next, a flexible window film according to one embodiment will be described with reference to FIG. 1. FIG. 1 is a sectional view of a flexible window film according to one embodiment of the invention.

Referring to FIG. 1, a flexible window film 100 according to one embodiment of the invention may include a base layer 110 and a coating layer 120, in which the coating layer 120 may be formed of the composition for window films according to the embodiment of the present invention.

The base layer 110 can improve mechanical strength of the flexible window film 100 by supporting the coating layer 120 of the flexible window film 100. The base layer 110 may be attached to a display part, a touchscreen panel or a polarizing plate via an adhesive layer or the like.

The base layer 110 may be formed of an optically transparent flexible resin. For example, the resin may include polyester resins including polyethylene terephthalate, polyethylene naphthalate, polybutylene terephthalate, polybutylene naphthalate, and the like, polycarbonate resins, polyimide resins, polystyrene resins, poly(meth)acrylate resins including poly(methyl methacrylate), and the like. For the base layer 110, these resins may be used alone or as a mixture thereof. The base layer 110 may have a thickness of 10 µm to 200 µm, specifically 20 µm to 150 µm, more specifically about 35 µm to about 100 µm, for example, 35 µm, 40 µm, 45 µm, 50 µm, 55 µm, 60 µm, 65 µm, 70 µm, 75 µm, 80 µm, 85 µm, 90 µm, 95 µm, or 100 µm. Within this thickness range, the base layer can be used in the flexible window film.

The coating layer 120 may be formed on the base layer 110 to protect the base layer 110, the display part, the touchscreen panel or the polarizing plate, and has high flexibility and high hardness to be used for a flexible display. The coating layer 120 may have a thickness of about 5 µm to about 100 µm, specifically about 5 µm to about 80 µm, for example, 10 µm, 15 µm, 20 µm, 25 µm, 30 µm, 35 µm, 40 µm, 45 µm, 50 µm, 55 µm, 60 µm, 65 µm, 70 µm, 75 µm, or 80 µm. Within this thickness range, the coating layer can be used in the flexible window film.

Although not shown in FIG. 1, functional surface layers such as an anti-reflection layer, an anti-glare layer, and a hard coating layer may be further formed on the other surface of the coating layer 120 to provide additional functions. In addition, although not shown in FIG. 1, the coating layer 120 may be further formed on the other surface of the base layer 110.

The flexible window film 100 is optically transparent and may be used in a transparent display. Specifically, the flexible window film 100 may have a transmittance of about 88% or more, specifically about 88% to about 100%, for example, 88%, 89%, 90%, 91%, 92%, 93%, 94%, 95%, 96%, 97%, 98%, 99%, or 100%, in the visible range, specifically in a wavelength range of 400 nm to 800 nm. Specifically, the flexible window film 100 may have a haze of about 1.5% or less, specifically about 0.1% to about 1.0%, for example, 0.1%, 0.2%, 0.3%, 0.4%, 0.5%, 0.6%, 0.7%, 0.8%, 0.9%, or 1.0%, in the visible range, specifically in a wavelength range of 400 nm to 800 nm. Within this range, the flexible window film can be used as a flexible window film.

The flexible window film 100 may have a pencil hardness of about 6H or higher, a radius of curvature of about 5.0 mm or less, and ΔY.I. of about 5.0 or less. Within these ranges, the flexible window film can exhibit good properties in terms of hardness, flexibility and light resistance, and thus can be used as a flexible window film. Specifically, the flexible window film 100 has a pencil hardness of about 6H to about 9H, for example, 6H, 7H, 8H, or 9H, a radius of curvature of about 0.1 mm to about 5.0 mm, for example, 0.1 mm, 0.5 mm, 1.0 mm, 1.5 mm, 2.0 mm, 2.5 mm, 3.0 mm, 3.5 mm, 4.0 mm, 4.5 mm, or 5.0 mm, and ΔY.I. of about 0.1 to about 5.0, for example, 0.1, 0.5, 1.0, 1.5, 2.0, 2.5, 3.0, 3.5, 4.0, 4.5, or 5.0.

The flexible window film 100 may have a thickness of about 50 µm to about 300 µm, specifically about 50 µm to about 200 µm, for example, 50 µm, 55 µm, 60 µm, 65 µm, 70 µm, 75 µm, 80 µm, 85 µm, 90 µm, 95 µm, 100 µm, 105 µm, 110 µm, 115 µm, 120 µm, 125 µm, 130 µm, 135 µm, 140 µm, 145 µm, 150 µm, 155 µm, 160 µm, 165 µm, 170 µm, 175 µm, 180 µm, 185 µm, 190 µm, 195 µm, or 200 µm. Within this thickness range, the flexible window film can be used as a flexible window film.

The flexible window film 100 may be formed by coating and curing the composition for window films according to the embodiment of the invention on the base layer 110.

A method of coating the composition for window films onto the base layer 110 is not particularly limited. For example, the composition for window films may be coated onto the base layer by bar coating, spin coating, dip coating, roll coating, flow coating, or die coating. The composition for window films may be coated to a thickness of about 5 µm to about 100 µm on the base layer 110. Within this thickness range, a desired coating layer can be secured while providing good properties in terms of hardness, flexibility and reliability.

Curing is performed to form the coating layer by curing the composition for window films, and may include at least one of photocuring and heat curing. Photocuring may include irradiating the coated composition at a dose of about 10 mJ/cm$^2$ to about 1,000 mJ/cm$^2$ at a wavelength of 400 nm or less. Heat curing may be performed at a temperature of about 40° C. to about 200° C. for about 1 hour to about 30 hours. Under these conditions, the composition for window films can be sufficiently cured. For example, heat curing may be performed after photocuring in order to achieve higher hardness of the coating layer.

Before curing the composition for window films coated onto the base layer 110, the method may further include drying the composition. When curing is performed after drying, it is possible to prevent increase in surface roughness of the coating layer due to photocuring or heat curing for a long period of time. Drying may be performed at about 40° C. to about 200° C. for about 1 minute to about 30 hours, without being limited thereto.

Next, a flexible window film according to another embodiment will be described with reference to FIG. 2. FIG. 2 is a sectional view of a flexible window film according to another embodiment of the invention.

Referring to FIG. 2, a flexible window film 200 according to another embodiment of the invention may include a base layer 110, a coating layer 120 formed on one surface of the base layer 110, and an adhesive layer 130 formed on the other surface of the base layer 110, in which the coating layer 120 may be formed of the composition for window films according to the embodiment of the present invention.

The adhesive layer 130 formed on the other surface of the base layer 110 can facilitate adhesion between the flexible window film and a touchscreen panel, a polarizing plate or a display part. The flexible window film according to this embodiment is substantially the same as the flexible window film according to the above embodiment excluding the adhesive layer. Thus, the following description will focus on the adhesive layer 130.

The adhesive layer 130 attaches a polarizing plate, a touchscreen panel, or a display part to the flexible window film 200 to be disposed under the flexible window film 200, and may be formed of an adhesive composition for the adhesive layer. Specifically, the adhesive layer 130 may be formed of an adhesive composition comprising an adhesive resin such as a (meth)acrylic resin, a urethane resin, a silicone resin, and an epoxy resin, a curing agent, a photoinitiator, and a silane coupling agent.

The (meth)acrylic resin is a (meth)acrylic copolymer having an alkyl group, a hydroxyl group, an aromatic group, a carboxylic acid group, an alicyclic group, a hetero-alicyclic group, and the like, and may include a typical (meth)acrylic copolymer. Specifically, the (meth)acrylic resin may be formed of a monomer mixture including at least one of a (meth)acrylic monomer containing a $C_1$ to $C_{10}$ unsubstituted alkyl group, a (meth)acrylic monomer containing a $C_1$ to $C_{10}$ alkyl group having at least one hydroxyl group, a (meth)acrylic monomer containing a $C_6$ to $C_{20}$ aromatic group, a (meth)acrylic monomer containing a carboxylic acid group, a (meth)acrylic monomer containing a $C_3$ to $C_{20}$ alicyclic group, and a (meth)acrylic monomer containing a $C_3$ to $C_{10}$ hetero-alicyclic group having at least one of nitrogen (N), oxygen (O), and sulfur (S).

The curing agent is a polyfunctional (meth)acrylate and may include a bifunctional (meth)acrylate such as hexanediol diacrylate; a trifunctional (meth)acrylate such as trimethylolpropane tri(meth)acrylate; a tetra-functional (meth)acrylate such as pentaerythritol tetra(meth)acrylate; a penta-functional (meth)acrylate such as dipentaerythritol penta(meth)acrylate; and a hexa-functional (meth)acrylate such as dipentaerythritol hexa(meth)acrylate, without being limited thereto.

The photoinitiator is a typical photoinitiator and may include the photo-radical initiator described above.

The silane coupling agent may include an epoxy group-containing silane coupling agent such as 3-glycidoxypropyltrimethoxysilane.

The adhesive composition may include 100 parts by weight of the (meth)acrylic resin, about 0.1 parts by weight to about 30 parts by weight of the curing agent, about 0.1 parts by weight to about 10 parts by weight of the photoinitiator, and about 0.1 parts by weight to about 20 parts by weight of the silane coupling agent. With this composition, the adhesive layer formed of the adhesive composition can sufficiently attach the flexible window film to the display part, the touchscreen panel, or the polarizing plate.

The adhesive layer 130 may have a thickness of about 10 μm to about 100 μm, for example, 10 μm, 20 μm, 30 μm, 40 μm, 50 μm, 60 μm, 70 μm, 80 μm, 90 μm, or 100 μm. Within this thickness range, the adhesive layer can sufficiently attach the flexible window film to an optical device such as a polarizing plate.

Next, a flexible display according to one embodiment will be described with reference to FIG. 3 and FIG. 4. FIG. 3 is a sectional view of a flexible display according to one embodiment of the present invention and FIG. 4 is a sectional view of one embodiment of a display part shown in FIG. 3.

Referring to FIG. 3, a flexible display 300 according to one embodiment of the invention includes a display part 350a, an adhesive layer 360, a polarizing plate 370, a touchscreen panel 380, and a flexible window film 390, which may include the flexible window film according to the embodiments of the invention. Although FIG. 3 shows the structure of the flexible display 300 in which the display part 350a, the adhesive layer 360, the polarizing plate 370, the touchscreen panel 380, and the flexible window film 390 are sequentially formed, the flexible display 300 may have a structure in which the display part 350a, the touchscreen panel 380, the polarizing plate 370, and the flexible window film 390 are sequentially formed. In this structure, since the display part 350a is formed together with the touchscreen panel 380, the flexible display has a thinner thickness and better brightness than the flexible display according to the above embodiment, thereby providing better visibility.

The display part 350a serves to drive the flexible display 300 and may include a substrate and an optical device formed on the substrate and including an OLED, an LED or an LCD device.

FIG. 4 is a sectional view of one embodiment of the display part shown in FIG. 3. Referring to FIG. 4, the display part 350a includes a lower substrate 310, a thin film transistor 316, an organic light emitting diode 315, a flattening layer 314, a protective layer 318, and an insulating layer 317.

The lower substrate 310 supports the display part 350a, and the thin film transistor 316 and the organic light emitting diode 315 may be formed on the lower substrate 310. The lower substrate 310 may be formed with a flexible printed circuit board (FPCB) for driving the touchscreen panel 380. The flexible printed circuit board may further include a timing controller, a power source, and the like in order to drive an array of organic light emitting diodes.

The lower substrate 310 may include a substrate formed of a flexible resin. Specifically, the lower substrate 310 may include a flexible substrate such as a silicone substrate, a polyimide substrate, a polycarbonate substrate, and a polyacrylate substrate, without being limited thereto.

In a display area of the lower substrate 310, plural pixel domains are defined by plural driving wires (not shown) and plural sensor wires (not shown) intersecting each other and each of the pixel domains may be formed with an array of organic light emitting diodes, each of which includes the thin film transistor 316 and the organic light emitting diode 315 connected to the thin film transistor 316. In a non-display area of the lower substrate, a gate driver applying electrical signals to the driving wires may be formed in the form of a gate-in panel. The gate-in panel circuit may be formed at one or both sides of the display area.

The thin film transistor 316 controls electric current flowing through a semiconductor by application of an electric field perpendicular to the electric current and may be formed on the lower substrate 310. The thin film transistor 316 may include a gate electrode 310a, a gate insulation layer 311, a semiconductor layer 312, a source electrode 313a, and a drain electrode 313b. The thin film transistor 316 may be an oxide thin film transistor which uses an oxide such as indium gallium zinc oxide (IGZO), ZnO, or TiO as the semiconductor layer, an organic thin film transistor which uses an organic material as the semiconductor layer, an amorphous silicon thin film transistor which uses amorphous silicon as the semiconductor layer, or a polycrystalline silicon thin film transistor which uses polycrystalline silicon as the semiconductor layer.

The flattening layer 314 covers the thin film transistor 316 and a circuit section 310b to flatten upper surfaces of the thin film transistor 316 and the circuit section 310b such that the organic light emitting diode 315 can be formed thereon. The flattening layer 314 may be formed of a spin-on-glass (SOG) film, a polyimide polymer, or a polyacrylic polymer, without being limited thereto.

The organic light emitting diode 315 realizes a display through self-emission, and may include a first electrode 315a, an organic light-emitting layer 315b, and a second electrode 315c, which are stacked in the stated order. Adjacent organic light emitting diodes may be isolated from each other by the insulating layer 317. The organic light emitting diode 315 may have a bottom emission type structure wherein light generated from the organic light-emitting layer 315b is emitted through the lower substrate, or a top-emission type structure wherein light from the organic light-emitting layer 315b is emitted through an upper substrate.

The protective layer 318 covers the organic light emitting diodes 315 to protect the organic light emitting diodes 315. The protective layer 318 may be formed of an inorganic material such as SiOx, SiNx, SiC, SiON, SiONC, and amorphous carbon (a-C), or an organic material such as (meth)acrylates, epoxy polymers, imide polymers, and the like. Specifically, the protective layer 318 may include an encapsulation layer in which an inorganic material layer and an organic material layer are sequentially stacked once or plural times.

Referring again to FIG. 3, the adhesive layer 360 attaches the display part 350a to the polarizing plate 370, and may be formed of an adhesive composition including a (meth) acrylate resin, a curing agent, an initiator, and a silane coupling agent.

The polarizing plate 370 can realize polarization of internal light or prevent reflection of external light to realize a display, or can increase contrast of the display. The polarizing plate may be composed of a polarizer alone. Alternatively, the polarizing plate may include a polarizer and a protective film formed on one or both surfaces thereof. Alternatively, the polarizing plate may include a polarizer and a protective coating layer formed on one or both surfaces thereof. As the polarizer, the protective film and the protective coating layer, a typical polarizer, a typical protective film and a typical protective coating layer known in the art may be used.

The touchscreen panel 380 generates electrical signals through detection of variation in capacitance when a human body or a conductor such as a stylus touches the touchscreen panel, and the display part 350a may be driven by such electrical signals. The touchscreen panel 380 is formed by patterning a flexible conductor, and may include first sensor electrodes and second sensor electrodes each formed between the first sensor electrodes and intersecting the first sensor electrodes. The touchscreen panel 380 may include a conductive material such as metal nanowires, conductive polymers, and carbon nanotubes, without being limited thereto.

The flexible window film 390 may be disposed as an outermost layer of the flexible display 300 to protect the flexible display.

Although not shown in FIG. 3, adhesive layers may be further formed between the polarizing plate 370 and the touchscreen panel 380 and/or between the touchscreen panel 380 and the flexible window film 390 to reinforce coupling between the polarizing plate, the touchscreen panel, and the flexible window film. The adhesive layers may be formed of an adhesive composition including a (meth)acrylate resin, a curing agent, an initiator, and a silane coupling agent.

Although not shown in FIG. 3, a polarizing plate may be further disposed under the display part 350a to realize polarization of internal light.

Next, a flexible display according to another embodiment of the present invention will be described with reference to FIG. 5. FIG. 5 is a sectional view of a flexible display according to another embodiment of the present invention.

Referring to FIG. 5, a flexible display 400 according to another embodiment of the invention includes a display part 350a, a touchscreen panel 380, a polarizing plate 370, and a flexible window film 390, which may include the flexible window film according to the embodiments of the invention. The flexible display according to this embodiment is substantially the same as the flexible display according to the above embodiment except that the touchscreen panel 380 is disposed under the polarizing plate 370 instead of being directly formed on the flexible window film 390. In addition, the touchscreen panel 380 may be formed together with the display part 350a. In this case, since the touchscreen panel 380 is formed together with the display part 350a on the display part 350a, the flexible display according to this embodiment is thinner and brighter than the flexible display according to the above embodiment, thereby providing better visibility. Furthermore, the touchscreen panel 380 may be formed by deposition, without being limited thereto. Although not shown in FIG. 5, adhesive layers may be further formed between the display part 350a and the touchscreen panel 380, between the touchscreen panel 380 and the polarizing plate 370, and/or between the polarizing plate 370 and the flexible window film 390 to reinforce mechanical strength of the display. The adhesive layers may be formed of an adhesive composition including a (meth) acrylate resin, a curing agent, an initiator, and a silane coupling agent. Although not shown in FIG. 5, a polarizing plate may be further disposed under the display part 350a to provide a good display image through polarization of internal light.

Next, a flexible display according to a further embodiment of the present invention will be described with reference to FIG. 6. FIG. 6 is a sectional view of a flexible display according to a further embodiment of the present invention. Referring to FIG. 6, a flexible display 500 according to a further embodiment of the invention includes a display part 350b, an adhesive layer 360, and a flexible window film 390, which may include the flexible window film according to the embodiments of the invention. The flexible display according to this embodiment is substantially the same as the flexible display according to the one embodiment except that the flexible display can be driven by the display part 350b alone and the polarizing plate and the touchscreen panel are omitted.

The display part 350a may include a substrate and an optical device formed on the substrate and including an OLED, an LED or an LCD device. The display part 350b may further include a touchscreen panel therein.

Although the flexible window films according to the embodiments of the invention are described as being applied to the flexible displays as shown in FIGS. 3 to 6, it should be understood that the flexible window films according to the embodiments of the invention may also be applied to a non-flexible display.

Hereinafter, the present invention will be described in more detail with reference to some examples. It should be understood that these examples are provided for illustration only and are not to be construed in any way as limiting the present invention.

Preparative Example: Preparation of Second Silicone Monomer

In a 250 mL flask, 35 mmol of tri(ethylene glycol)divinyl ether (Aldrich) and 150 ppm of a platinum catalyst(Umicore, PT-CS-1.8CS) were mixed with toluene under a nitrogen atmosphere. Then, 70 mmol of triethoxysilane (Aldrich) was added to the mixture, followed by stirring at 45° C. for 2 hours. Thereafter, the platinum catalyst was removed using activated carbon, thereby preparing a second silicone monomer represented by Formula 2-1.

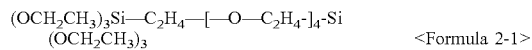

<Formula 2-1>

Example 1

50 g of a silicone monomer mixture comprising 97 mol % of 2-(3,4-epoxycyclohexyl)ethyltriethoxysilane (Sigma Aldrich) and 3 mol % of 1,2-bis(triethoxysilyl)ethane(Sigma Aldrich) was placed in a 200 ml 2-neck flask. Then, 2 mol % of KOH relative to the amount of the monomer mixture and 1 mol % of water relative to the mole number of an ethoxy group in the monomer mixture were added to the flask, followed by stirring at 65° C. for 2 hours, thereby preparing a silicone resin represented by $(EcSiO_{3/2})_{0.97}(SiO_{3/2}-C_2H_4-SiO_{3/2})_{0.03}$ (Ec is a 2-(3,4-epoxycyclohexyl)ethyl group). After the remaining solvent was removed from the flask using a vacuum distillation device, methylisobutylketone was added to the silicone resin to have a solid content of 90 wt %. The silicone resin had a weight average molecular weight of 6,000, as measured by gel permeation chromatography.

A composition for window films was prepared by mixing 100 parts by weight of the silicone resin, 10 parts by weight of a crosslinking agent (CY-179, Ciba Chemical), and 2 parts by weight of diphenyliodonium hexafluorophosphate as an initiator (TCI).

The prepared composition was coated onto an 80 μm thick polyimide film, dried at 100° C. for 5 minutes, subjected to UV irradiation at 1,000 mJ/cm², and heated at 100° C. for 12 hours, thereby preparing a window film having a 50 μm thick coating layer.

Examples 2 to 8

Each silicone resin was prepared in the same manner as in Example 1 except that the kind of silicone monomer and/or the content of each component in the monomer mixture were changed as listed in Table 1. Each composition for window films was prepared in the same manner as in Example 1 using the prepared silicone resins. Each window film was prepared in the same manner as in Example 1 using the prepared compositions for window films.

Example 9

100 g of a silicone monomer mixture comprising 99 mol % of 2-(3,4-epoxycyclohexyl)ethyltriethoxysilane (Shin-Etsu Chemical Co., Ltd.) and 1 mol % of the second silicone monomer of Preparative Example was placed in a 500 ml 3-neck flask. Then, relative to the amount of the monomer mixture, 0.05 mol % of KOH and 1.52 mol % of water were added to the monomer mixture, followed by stirring at 25° C. for 1 hour and additional stirring at 70° C. for 2 hours. Thereafter, the remaining solvent was removed from the mixture using a vacuum distillation device, thereby preparing a silicone resin (weight average molecular weight: 4,900, as measured by gel permeation chromatography).

A composition for window films was prepared by mixing 100 parts by weight of the silicone resin, 20 parts by weight parts of bis(3,4-epoxycyclohexylmethyl)adipate as a crosslinking agent, and 2 parts by weight of diphenyliodonium hexafluorophosphate (DPI-PF6, TCI) as an initiator. The composition for window films was transparent as observed by the naked eye. The prepared composition was coated onto one surface of a transparent polyimide film (Samsung SDI, thickness: 80 μm), dried at 60° C. for 4 minutes, subjected to UV irradiation at 500 mJ/cm², and heated at 100° C. for 24 hours, thereby preparing a window film having a 50 μm thick coating layer.

Examples 10 and 11

Each window film was prepared in the same manner as in Example 9 except that components of compositions for window films were changed as listed in Table 2.

Example 12

86.4 mol % of 3-glycidoxypropyltrimethoxysilane (Shin-Etsu Chemical Co., Ltd.), 9.1 mol % of 3-aminopropyltriethoxysilane (Shin-Etsu Chemical Co., Ltd.), and 52% of toluene were placed in a 500 ml 3-neck flask. Then, relative to the amount of the monomer mixture, 0.5 mol % of KOH and 0.75 mol % of water were added to the monomer mixture, followed by stirring at 25° C. for 1 hour. Then, 4.5 mol % of 4,4'-(hexafluoroisopropylidene)diphthalic anhydride (Aldrich) was added to the mixture and stirred at 25° C. for 1 hour, followed by stirring at 70° C. for 12 hours. Thereafter, the remaining solvent was removed from the mixture using a vacuum distillation device, thereby preparing a silicone resin (weight average molecular weight: 7,000, as measured by gel permeation chromatography). A composition for window films was prepared by mixing 100 parts by weight of the silicone resin, 20 parts by weight parts of bis(3,4-epoxycyclohexylmethyl)adipate as a crosslinking agent, and 2 parts by weight of diphenyliodonium hexafluorophosphate (DPI-PF6, TCI) as an initiator. A window film was prepared in the same manner as in Example 9 using the prepared composition for window films.

Examples 13 and 14

Each window film was prepared in the same manner as in Example 12 except that components of compositions for window films were changed as listed in Table 2.

Comparative Examples 1 and 2

Each silicone resin was prepared in the same manner as in Example 1 except that the kind of silicone monomer and/or the content of each component in the monomer mixture were changed as listed in Table 1. Each composition for window films was prepared in the same manner as in Example 1 using the prepared silicone resins. Each window film was prepared in the same manner as in Example 1 using the prepared compositions.

Comparative Example 3

A silicone resin was prepared in the same manner as in Example 1. A composition for window films was prepared by mixing 100 parts by weight of the prepared silicone resin and 2 parts by weight of diphenyliodonium hexafluorophosphate (TCI). A window film was prepared in the same manner as in Example 1 using the prepared composition.

Comparative Example 4

50 g of a silicone monomer mixture comprising 100 mol % of 2-(3,4-epoxycyclohexyl)ethyltriethoxysilane (Sigma Aldrich) was placed in a 200 ml 2-neck flask. Then, 2 mol % of KOH relative to the amount of 2-(3,4-epoxycyclohexyl)ethyltriethoxysilane and 1 mol % of water relative to the mole number of an ethoxy group in 2-(3,4-epoxycyclohexyl)ethyltriethoxysilane were added to the flask, followed by stirring at 65° C. for 4 hours. After the remaining solvent was removed from the flask using a vacuum distillation device, methylisobutylketone was added to the flask to have a solid content of 90 wt %. The silicone resin had a weight average molecular weight of 6,000, as measured by gel permeation chromatography.

A composition for window films was prepared by mixing 100 parts by weight of the silicone resin, 10 parts by weight of a crosslinking agent (CY-179, Ciba Chemical), 2 parts by weight of diphenyliodonium hexafluorophosphate (TCI), and 10 parts by weight of 1,2-bis(triethoxysilyl)ethane. A window film was prepared in the same manner as in Example 1 using the prepared composition.

Comparative Example 5

50 g of a silicone monomer mixture comprising 97 mol % of 2-(3,4-epoxycyclohexyl)ethyltriethoxysilane (Sigma Aldrich) and 3 mol % of 1,2-bis(triethoxysilyl)ethane (Sigma Aldrich) was placed in a 200 ml 2-neck flask. Then, 2 mol % of KOH relative to the amount of the monomer mixture and 1 mol % of water relative to the mole number of an ethoxy group in the monomer mixture were added to the flask, followed by stirring at 20° C. for 4 hours. After the remaining solvent was removed from the flask using a vacuum distillation device, methylisobutylketone was added to the flask to have a solid content of 90 wt %.

A composition for window films was prepared by mixing 100 parts by weight of hydrolysates of 2-(3,4-epoxycyclohexyl)ethyltriethoxysilane and 1,2-bis(triethoxysilyl)ethane, 10 part by weight of a crosslinking agent (CY-179, Ciba Chemical), and 2 parts by weight of diphenyliodonium hexafluorophosphate (TCI). A window film was prepared in the same manner as in Example 1 using the prepared composition.

The composition prepared in Comparative Example 5 comprises the hydrolysates of the silicone monomers instead of a silicone resin.

Comparative Examples 6 to 8

Each window film was prepared in the same manner as in Example 9 except that components of compositions for window films were changed as listed in Table 4.

Comparative Example 9

A window film was prepared in the same manner as in Example 12 except that components of compositions for window films were changed as listed in Table 4.

The window films prepared in Examples and Comparative Examples were evaluated as to Properties (1) to (4) and evaluation results are shown in Tables 1 to 4.

(1) Pencil hardness: Pencil hardness was measured on a coating layer of a window film using a pencil hardness tester (Heidon) in accordance with JIS K5400. Pencil hardness was measured using pencils of 6B to 9H (Mitsubishi Co., Ltd.) under conditions of a pencil load of 1 kg on the coating layer, a scratch angle of 45°, and a scratch speed of 60 mm/min. When the coating layer had one or more scratches after being tested 5 times using a certain pencil, pencil hardness was measured again using another pencil having one-level lower pencil hardness than the previous pencil. A pencil hardness value allowing no scratch to be observed all five times on the coating layer was taken as pencil hardness of the coating layer.

(2) Radius of curvature: A window film (width×length× thickness, 3 cm×15 cm×130 μm, base layer thickness: 50 μm, coating layer thickness: 50 μm) was wound around a jig for measuring radius of curvature, kept wound for 5 seconds or more, unwound, and then observed with the naked eye to determine whether the window film had cracks. Here, a radius of curvature in a compressive direction was measured by winding the specimen wound around the jig such that the coating layer of the window film contacted the jig, and a radius of curvature in a tensile direction was measured by winding the specimen around the jig such that the base layer of the window film contacted the jig. The radius of curvature was determined by a minimum radius of a jig causing no cracks on the window film, as measured while gradually decreasing the diameters of jigs from a jig having the maximum diameter in the compressive direction.

(3) ΔY.I.: A yellow index (Y1) was measured on a window film under a D65 light source at 2° (angle between the window film and the light source) using a colorimeter (CM-3600D, Konica Minolta). Then, a yellow index (Y2) was measured on the window film by the same method after irradiating the window film at a peak wavelength of 306 nm for 72 hours using a light resistance tester (Xe-1, Q-sun). Optical reliability such as light resistance was determined based on a difference in yellow index (Y2-Y1, ΔY.I.) between before and after irradiation.

(4) External appearance: External appearance was evaluated by determining the presence of an irregular shadow on a black sheet with the naked eye when the coating layer of the window film placed 10 cm above the black sheet was irradiated with light. Generation of no wave patterns, no orange peel such as an orange surface and no wrinkles was evaluated as '3', generation of one or two defects among the orange peel, wave patterns and wrinkles was evaluated as '2', and generation of all of these defects was evaluated as '1'.

TABLE 1

|  | Example 1 | Example 2 | Example 3 | Example 4 | Example 5 | Example 6 | Example 7 | Example 8 |
|---|---|---|---|---|---|---|---|---|
| 2-(3,4-epoxycyclohexyl)ethyltriethoxysilane (mol %) | 97 | 95 | — | — | 97 | 95 | — | — |
| 3-glycidoxypropyltrimethoxysilane (mol %) | — | — | 97 | 95 | — | — | 97 | 95 |
| 1,2-bis(triethoxysilyl)ethane (mol %) | 3 | 5 | 3 | 5 | — | — | — | — |
| 1,4-bis(triethoxysilyl)benzene (mol %) | — | — | — | — | 3 | 5 | 3 | 5 |
| Crosslinking agent (parts by weight) | 10 | 10 | 10 | 10 | 10 | 10 | 10 | 10 |
| Initiator (parts by weight) | 2 | 2 | 2 | 2 | 2 | 2 | 2 | 2 |
| Pencil hardness | 8H | 8H | 7H | 7H | 8H | 8H | 7H | 7H |
| Radius of curvature (mm) | 3.2 | 3.5 | 2.2 | 2.4 | 3.5 | 3.7 | 2.7 | 2.9 |
| ΔY.I. | 1.8 | 1.9 | 1.9 | 2.0 | 2.1 | 2.2 | 2.2 | 2.3 |

TABLE 2

|  |  | Example 9 | Example 10 | Example 11 | Example 12 | Example 13 | Example 14 |
|---|---|---|---|---|---|---|---|
| Monomer | 2-(3,4-epoxycyclohexyl)ethyltriethoxysilane (mol %) | 99 | 97 | 95 | — | — | — |
| Monomer | 3-glycidoxypropyltrimethoxysilane (mol %) | — | — | — | 86.4 | 86.4 | 86.4 |
| Monomer | Second silicone monomer of preparative Example (mol %) | 1 | 3 | 5 | — | — | — |
| Monomer | Third silicone monomer (mol %) | — | — | — | 9.1 | 9.1 | 9.1 |
| Monomer | Bifunctional anhydride (mol %) | — | — | — | 4.5 | 4.5 | 4.5 |
| Siloxane rein | x in Formula 1 | 0.99 | 0.97 | 0.95 | 0.95 | 0.95 | 0.95 |
| Siloxane rein | y in Formula 1 | 0.01 | 0.03 | 0.05 | 0.05 | 0.05 | 0.05 |
| Siloxane rein | Weight average molecular weight | 4,900 | 4,900 | 5,000 | 7,000 | 7,000 | 7,000 |
| Crosslinking agent | Crosslinking agent b (parts by weight) | 20 | 20 | — | 20 | — | — |
| Crosslinking agent | Crosslinking agent c (parts by weight) | — | — | 20 | — | 20 | — |
| Crosslinking agent | Crosslinking agent d (parts by weight) | — | — | — | — | — | 20 |
| — | Initiator (parts by weight) | 2 | 2 | 2 | 2 | 2 | 2 |
| — | Leveling agent* (parts by weight) | — | — | — | — | — | — |
| — | Tri(ethylene glycol)divinyl ether (parts by weight) | — | — | — | — | — | — |
| — | Transparency of window coating composition | Transparent | Transparent | Transparent | Transparent | Transparent | Transparent |
| — | Pencil hardness | 8H | 7H | 7H | 8H | 8H | 8H |
| — | Radius of curvature (mm) | 3 | 3 | 3 | 3 | 3 | 3 |
| — | External appearance | 2 | 3 | 3 | 2 | 2 | 2 |

TABLE 3

|  | Comparative Example 1 | Comparative Example 2 | Comparative Example 3 | Comparative Example 4 | Comparative Example 5* |
|---|---|---|---|---|---|
| 2-(3,4-epoxycyclohexyl)ethyltriethoxysilane (mol %) | 100 | — | 97 | 100 | 97 |
| 3-glycidoxypropyltrimethoxysilane (mol %) | — | 100 | — | — | — |
| 1,2-bis(triethoxysilyl)ethane (mol %) | — | — | 3 | — | 3 |
| 1,4-bis(triethoxysilyl)benzene (mol %) | — | — | — | — | — |
| Crosslinking agent (parts by weight) | 10 | 10 | — | 10 | 10 |
| Initiator (parts by weight) | 2 | 2 | 2 | 2 | 2 |
| 1,2-bis(triethoxysilyl)ethane (parts by weight) | — | — | — | 10 | — |
| Pencil hardness | 5H | 4H | 5H | 4H | 3H |
| Radius of curvature (mm) | 5.6 | 5.1 | 7.4 | 5.7 | 7.2 |
| ΔY.I. | 6.2 | 6.4 | 6.5 | 6.7 | 6.3 |

TABLE 4

|  |  | Comparative Example 6 | Comparative Example 7 | Comparative Example 8 | Comparative Example 9 |
|---|---|---|---|---|---|
| Monomer | 2-(3,4-epoxycyclohexyl)ethyltriethoxysilane (mol %) | 100 | 100 | 100 | — |
| Monomer | 3-glycidoxypropyltrimethoxysilane (mol %) | — | — | — | 100 |
| Monomer | Second silicone monomer (mol %) | — | — | — | — |
| Monomer | Third silicone monomer (mol %) | — | — | — | — |
| Monomer | Bifunctional anhydride (mol %) | — | — | — | — |
| Siloxane rein | x in Formula 1 | 1.0 | 1.0 | 1.0 | 1.0 |
| Siloxane rein | y in Formula 1 | 0 | 0 | 0 | 0 |
| Siloxane rein | Weight average molecular weight | 4,000 | 4,000 | 4,000 | 7,000 |
| Crosslinking agent | Crosslinking agent b (parts by weight) | 20 | 20 | 20 | 20 |
| Crosslinking agent | Crosslinking agent c (parts by weight) | — | — | — | — |
| Crosslinking agent | Crosslinking agent d (parts by weight) | — | — | — | — |
| — | Initiator (parts by weight) | 2 | 2 | 2 | 2 |
| — | Leveling agent* (parts by weight) | — | 0.2 | — | — |
| — | Tri(ethylene glycol)divinyl ether (parts by weight) | — | — | 1.0 | — |
| — | Transparency of window coating composition | Transparent | Oblique | Oblique | Transparent |
| — | Pencil hardness | 8H | — | — | 6H |
| — | Radius of curvature (mm) | 5 | — | — | 2 |
| — | External appearance | 1 | — | — | 1 |

Component in Tables 1 to 4 are as follows.
Crosslinking agent a: CY-179 (Ciba Chemical)
Crosslinking agent b: bis(3,4-epoxycyclohexylmethyl) adipate
Crosslinking agent c: 3,4-epoxycyclohexylmethyl-3',4'-epoxycyclohexane carboxylate (Jiangsu TetraChem),
Crosslinking agent d: diglycidyl 1,2-cyclohexane dicarboxylate, Initiator: diphenyliodonium hexafluorophosphate (DPI-PF6, TCI)
Leveling agent: polyether modified-polydimethylsiloxane (BYK3700, BYK)

As shown in Table 1, the window films formed of the compositions for window films prepared in Examples had a pencil hardness of about 6H or higher indicating good hardness, a radius of curvature of about 5.0 mm or less indicating good flexibility, and ΔY.I. of about 5.0 or less indicating good optical reliability. In addition, although not shown in Table 1, the window films formed of the compositions for window films prepared in Examples exhibited high adhesion with respect to the polyimide resin film acting as a base layer.

Furthermore, as shown in Table 2, the composition for window films of Examples exhibited good transparency. Further, since the window films of Examples exhibited good properties in terms of pencil hardness and external appearance and had a low radius of curvature indicating good flexibility, the window films of Examples could be used as a flexible window film.

On the contrary, the window films of Comparative Examples 1 and 2, prepared without using the silicone resin according to the embodiments of the invention, exhibited poorer properties in terms of pencil hardness, radius of curvature and optical reliability than the window films according to the present invention. The window film of Comparative Example 3, prepared without using a crosslinking agent, had a relatively high radius of curvature and thus exhibited insufficient flexibility. The window film of Comparative Example 4, which was prepared using 1,2-bis(triethoxysilyl)ethane in the form of a mixture instead of the silicone resin according to the embodiments of the invention, had relatively low pencil hardness. In addition, the window film of Comparative Example 5, which was prepared using the hydrolysates of the silicone monomers instead of the silicone resin according to the embodiments of the invention, had a high radius of curvature and relatively low pencil hardness.

Furthermore, the window film of Comparative Example 6, which was prepared without using the silicone resin according to the embodiments of the invention, exhibited poor external appearance and thus could not be used as a window film, the window film of Comparative Example 7, which was prepared using a typical leveling agent instead of the silicone resin according to the embodiments of the invention, and the composition for window films of Comparative Example 8, which was prepared using a precursor for preparation of the second monomer, was opaque and thus could not be used in manufacture of a window film. The window film of Comparative Example 9 had low pencil hardness.

It should be understood that various modifications, changes, alterations, and equivalent embodiments can be made by those skilled in the art without departing from the spirit and scope of the invention.

The invention claimed is:

1. A composition for window films, comprising:
a silicone resin comprising a compound represented by Formula 1; a crosslinking agent; and an initiator:

$(R^1SiO_{3/2})_x(SiO_{3/2}\text{-Q-}SiO_{3/2})_y(R^2SiO_{3/2})_z$  <Formula 1> wherein in Formula 1, $R^1$ and $R^2$ are each independently an alicyclic epoxy group, an alicyclic epoxy group-containing functional group, a glycidyl group, or a glycidyl group-containing functional group;

Q is $-A^1\text{-}T\text{-}A^2\text{-}$, $A^1$ and $A^2$ being each independently a single bond or a substituted or unsubstituted $C_1$ to $C_5$ alkylene group, T being a mono- or polyalkylene oxide group, or an imide group-containing functional group; and $0<x<1$, $0<y<1$, $0 \leq z<1$, and $x+y+z=1$.

2. The composition for window films according to claim 1, wherein the silicone resin is represented by at least one of Formulae 1-9 to 1-26:

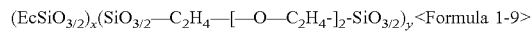
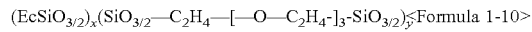
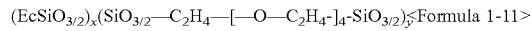
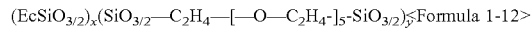
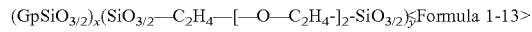
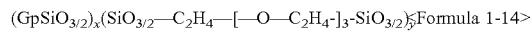
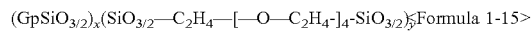
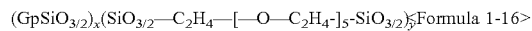
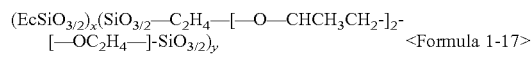
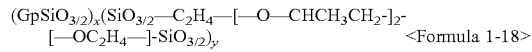

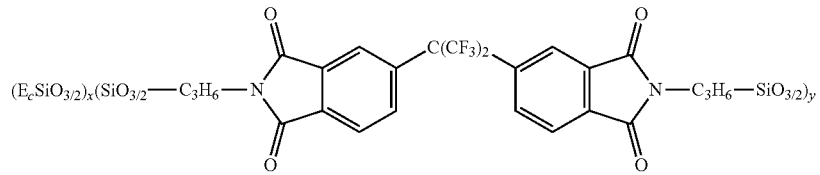

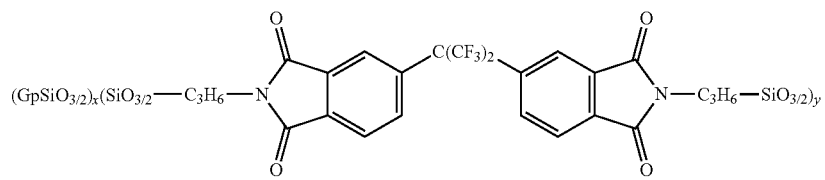

wherein in Formulae 1-9 to 1-20, Ec is an epoxycyclohexylethyl group, Gp is a plycidoxypropyl group, $0<x<1$, $0<y<1$, and $x+y=1$,

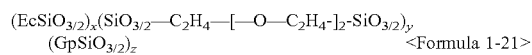
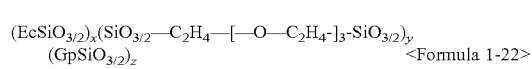
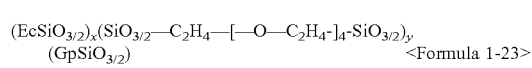
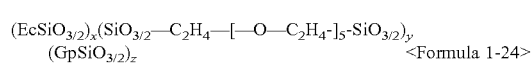
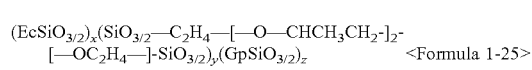

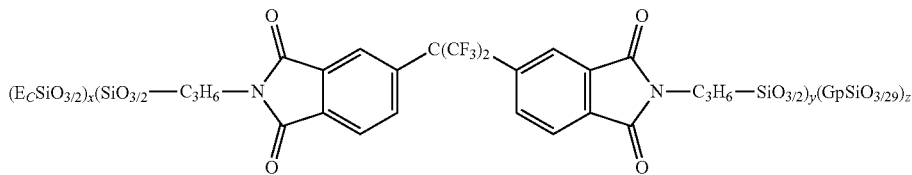

<Formula 1-26> wherein in Formulae 1-21 to 1-26, Ec is an epoxycyclohexylethyl group, Gp is a glycidoxypropyl group, $0<x<1$, $0<y<1$, $0<z<1$, and $x+y+z=1$.

3. The composition for window films according to claim 1, wherein the silicone resin has a weight average molecular weight of about 1,000 to about 30,000.

4. The composition for window films according to claim 1, wherein the crosslinking agent comprises at least one of an alicyclic epoxy carboxylate and an alicyclic epoxy (meth)acrylate.

5. The composition for window films according to claim 2, wherein the crosslinking agent comprises at least one of a non-cyclic aliphatic epoxy monomer, a cyclic aliphatic epoxy monomer, a hydrogenated aromatic hydrocarbon epoxy monomer, and an oxetane monomer.

6. The composition for window films according to claim 1, wherein the crosslinking agent is present in an amount of about 1 part by weight to about 30 parts by weight relative to 100 parts by weight of the silicone resin.

7. A flexible window film comprising: a base layer; and a coating layer formed on one surface of the base layer, wherein the coating layer is formed of the composition for window films according to claim 1.

8. The flexible window film according to claim 7, further comprising: an adhesive film formed on the other surface of the base layer.

9. The flexible window film according to claim 7, wherein the flexible window film has a pencil hardness of about 6H or higher, a radius of curvature of about 5.0 mm or less, and $\Delta$Y.I. of about 5.0 or less.

* * * * *